(12) United States Patent
Lin et al.

(10) Patent No.: US 7,635,608 B2
(45) Date of Patent: Dec. 22, 2009

(54) METHOD OF FABRICATING ORGANIC ELECTRONIC DEVICE

(75) Inventors: Tsung-Hsien Lin, Hsinchu (TW); Jia-Chong Ho, Hsinchu County (TW); Tarng-Shiang Hu, Hsinchu (TW); Cheng-Chung Lee, Taitung (TW)

(73) Assignee: Industrial Technology Research Institute, Hsinchu (TW)

( * ) Notice: Subject to any disclaimer, the term of this patent is extended or adjusted under 35 U.S.C. 154(b) by 182 days.

(21) Appl. No.: 11/554,576

(22) Filed: Oct. 30, 2006

(65) Prior Publication Data

US 2007/0161149 A1    Jul. 12, 2007

(30) Foreign Application Priority Data

Jan. 12, 2006    (TW)    ................ 95101178 A

(51) Int. Cl.
*H01L 21/00*    (2006.01)
*H01L 51/40*    (2006.01)

(52) U.S. Cl. ............... 438/99; 438/28; 438/29; 438/42; 257/E21.411

(58) Field of Classification Search ................ 438/28, 438/29, 42, 99; 257/E21.411
See application file for complete search history.

(56) References Cited

U.S. PATENT DOCUMENTS

| 5,486,126 | A  | * | 1/1996 | Cathey et al. | .................. 445/25 |
| 6,414,733 | B1 | * | 7/2002 | Ishikawa et al. | ............. 349/110 |
| 6,949,880 | B1 |   | 9/2005 | Guenther et al. | |
| 7,179,512 | B2 | * | 2/2007 | Ebisu et al. | ................... 428/1.5 |
| 7,432,533 | B2 | * | 10/2008 | Auch et al. | .................... 257/81 |
| 7,572,667 | B2 | * | 8/2009 | Ryu et al. | ...................... 438/99 |
| 2004/0150782 | A1 | * | 8/2004 | Honda et al. | .................. 349/158 |
| 2004/0233374 | A1 | * | 11/2004 | Yamazaki et al. | ........... 349/153 |
| 2005/0264176 | A1 | * | 12/2005 | Onozuka et al. | ............. 313/500 |

* cited by examiner

*Primary Examiner*—Alexander G Ghyka
*Assistant Examiner*—Seahvosh J Nikmanesh
(74) *Attorney, Agent, or Firm*—Jianq Chyun IP Office

(57) ABSTRACT

A fabricating method of organic electronic device is provided. The method comprises: providing a flexible substrate; fabricating a plurality of organic elements on the flexible substrate; fabricating a patterned spacing layer on the flexible substrate; and arranging a cover substrate on the patterned spacing layer, and sealing the edges of the flexible substrate and the cover substrate with a sealant, wherein the patterned spacing layer is used to maintain a space between the flexible substrate and the cover substrate.

19 Claims, 5 Drawing Sheets

METHOD OF FABRICATING ORGANIC ELECTRONIC DEVICE

CROSS-REFERENCE TO RELATED APPLICATION

This application claims the priority benefit of Taiwan application serial no. 95101178, filed Jan. 12, 2006. All disclosure of the Taiwan application is incorporated herein by reference.

BACKGROUND OF THE INVENTION

1. Field of Invention

The present invention relates to a method of fabricating an electronic device. More particularly, the present invention relates to a method of fabricating an organic electronic device.

2. Description of Related Art

With the improvement of semiconductor processing techniques, many electronic devices are now fabricated on silicon substrates with semiconductor processes. In terms of flat displays, the required elements are fabricated on glass substrates with semiconductor processes. However, silicon substrates and glass substrates are both hard substrates, thus the electronic devices produced cannot be bent. To make electronic devices lighter, thinner, and flexible, flexible substrates such as plastic substrates have been used in the fabrication of electronic devices.

Besides, as for the material selection of electronic devices, now some electronic devices can be fabricated with organic materials, for example, organic thin film transistors (OTFTs). In comparison with traditional inorganic transistors, OTFTs can be fabricated at a low temperature, so lighter, thinner, and cheaper plastic can substitute glass to function as the substrate. Meanwhile, plastic substrates are advantageous as they are flexible. Furthermore, the OTFT process is simple. By directly patterning organic thin films with printing techniques, the number of required masks and vacuum evaporation apparatus can be reduced. In addition, the manufacturing cost can be greatly reduced because OTFT process is suitable for plastic substrates and is highly compatible with the roll-to-roll process.

However, in a traditional flat display employing OTFTs and plastic substrates, the electronic elements are sealed between two plastic substrates with a sealant at their edges. In this case, when the flat display is flexed, electronic elements will be easily in contact with the plastic substrates, and problems of scratching, wear, and even damage will be occurred since a fixed space cannot be maintained between the two plastic substrates.

SUMMARY OF THE INVENTION

Accordingly, an object of the present invention is to provide a method of fabricating organic electronic device, which is applicable for solving the problem that the electronic devices of the organic electronic device employing flexible substrates will be easily in contact with the plastic substrates and thus damaged when the device is flexed.

The present invention provides a method of fabricating the organic electronic device. The method comprises: providing a flexible substrate; fabricating organic elements on the flexible substrate; fabricating a patterned spacing layer on the flexible substrate; and arranging a cover substrate on the patterned spacing layer, and sealing the edges of the flexible substrate and the cover substrate with a sealant, wherein, the patterned spacing layer is used to maintain a space between the flexible substrate and the cover substrate.

In one embodiment of the method of fabricating the organic electronic device, the step for fabricating organic elements is performed before fabricating the patterned spacing layer; and the organic elements include OTFTs. Furthermore, the step for fabricating the patterned spacing layer includes, for example, covering the organic elements with the patterned spacing layer. In addition, a plurality of Organic Electro Luminescent Devices (OLEDs) can further be fabricated on the flexible substrate in an area without covered by the patterned spacing layer after the patterned spacing layer is fabricated and before the cover substrate is arranged.

In one embodiment of the method of fabricating the organic electronic device, the step for fabricating the organic elements is performed after the patterned spacing layer is fabricated. The organic elements are formed on the flexible substrate in an area without covered by the patterned spacing layer, and the organic elements include OLEDs.

In one embodiment of the method of fabricating the organic electronic device, the method of fabricating the patterned spacing layer includes: coating a spacing material layer on the flexible substrate; and patterning the spacing material layer to form the patterned spacing layer. Furthermore, the spacing material layer can be pre-baked after coating the spacing material layer and before patterning the spacing material layer. In addition, the method of coating the spacing material layer is, for example, a spin coating. Moreover, the spacing material layer can be photosensitive, and the method of patterning the spacing material layer includes photolithography and etching. In addition, the material of the patterned spacing layer can be a polymer, for example, a photo-patterned polymer, a polymer mixed with microcolumns, or a combination thereof, and the material of the patterned spacing layer can also be, for example, dichromated polyvinyl alcohol (DCPVA), polyvinyl pyrrolidone (PVP), polyimide (PI), or a combination thereof.

In one embodiment of the method of fabricating the organic electronic device, the method of fabricating the patterned spacing layer includes depositing the patterned spacing layer on the flexible substrate by using a spacing material deposition source and a mask. Furthermore, the patterned spacing layer can be deposited by the spacing material deposition source with a method comprising at least one of Plasma Enhanced Chemical Vapor Deposition (PECVD), Vacuum Thermal Evaporation (VTE), E-beam Evaporation, sputtering or any combination thereof. In addition, the material of the patterned spacing layer can be a polymer, for example, an organic oligomer, a polymer mixed with microcolumns, or a combination thereof, or, for example, parylene. Moreover, the material of the patterned spacing layer can be an oxide, for example, a metal oxide derivative.

In one embodiment of the method of fabricating the organic electronic device, the method of fabricating the patterned spacing layer includes: depositing a spacing material layer on the flexible substrate; and patterning the spacing material layer to form the patterned spacing layer. Furthermore, the method of depositing the spacing material layer may comprise at least one of PECVD, VTE, E-beam Evaporation, sputtering or any combination thereof. In addition, the method of patterning the spacing material layer is, for example, performing photo cracking or thermal cracking on the spacing material layer with a laser to perform the patterning process directly. Moreover, the material of the patterned spacing layer is, for example, a polymer, or a polymer mixed with microcolumns, or, for example, parylene.

To sum up, in the method of fabricating the organic electronic device of the present invention, the space between the flexible substrate and the cover substrate is maintained by the patterned spacing layer so as to prevent the electronic elements in the organic electronic device from being damaged when the device is flexed. Furthermore, the patterned spacing layer can selectively cover and protect the organic elements, which functions as a protective layer. In addition, the present invention also has the advantages that the patterned spacing layer can be localized with high precision, and that the present invention is compatible with the roll-to-roll process and the batch type process.

In order to make the above and other objects, features and advantages of the present invention more comprehensible, preferred embodiments accompanied with drawings are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The method of fabricating the organic electronic device of the present invention relates to fabricating a plurality of organic elements and a patterned spacing layer on a flexible substrate, and sealing a cover substrate and the flexible substrate with a sealant. The patterned spacing layer is used to maintain a space between the flexible substrate and the cover substrate. By using the patterned spacing layer capable of being localized with high precision, when the organic electronic device is flexed, the organic elements of the flexible substrate will be not in contact with the cover substrate and can be prevented from being damaged. Three embodiments capable of achieving the object will be described below.

Embodiment 1

Figure 1A:
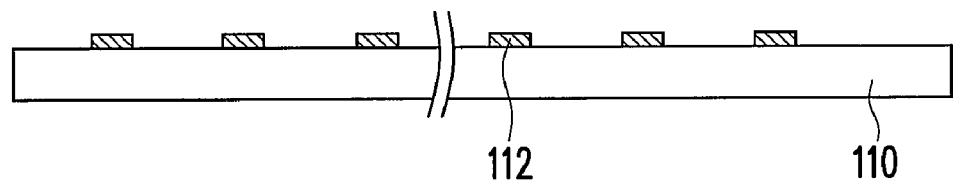
FIGS. 1A-1F are sectional views of the flow of the method of fabricating the organic electronic device according to the first embodiment of the present invention.

FIGS. 1A-1F are sectional views of the flow of the method of fabricating the organic electronic device according to the first embodiment of the present invention. Referring to FIG. 1A, the method of fabricating the electronic device of the embodiment comprises providing a flexible substrate 110 first. The flexible substrate 110 may be a plastic substrate, a metal sheet, a macromolecular substrate, an organic-inorganic mixing substrate, or a glass substrate with a thickness of less than 1 mm. A plurality of electronic elements 112 can be selectively formed on the flexible substrate 110. The electronic elements 112 are, for example, thin film transistors or other circuits. In particular, the electronic elements 112 may be organic or inorganic thin film transistors.

Figure 1B:
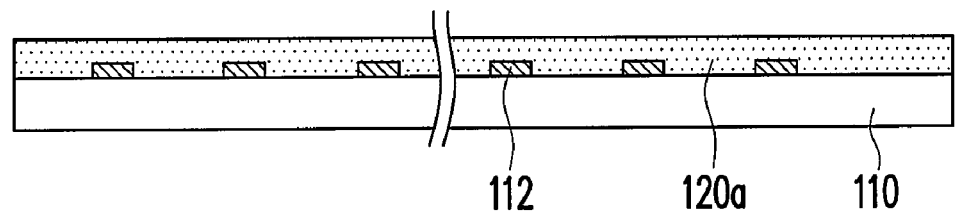

Referring to FIG. 1B, a spacing material layer 120a is coated on the flexible substrate 110, wherein the method of coating spacing material layer 120a is, for example, dissolving a polymer or a polymer mixed with microcolumns into an appropriate solvent, and coating the solution on the flexible substrate 110 in the manner of spin coating or in other manners. Furthermore, after coating the spacing material layer 120a on the flexible substrate 110, the spacing material layer 120a can be optionally pre-baked to slightly cure the layer. The time for pre-baking is, for example, 1 hour. In addition, the spacing material layer 120a is, for example, photosensitive.

Figure 1C:
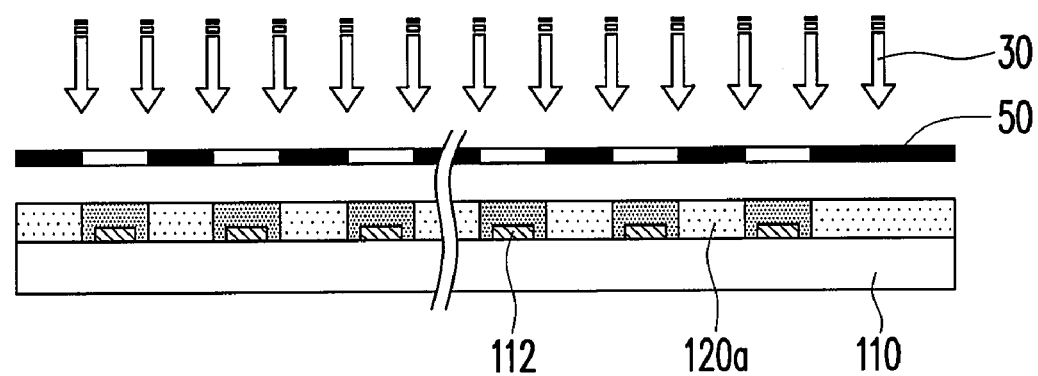
Figure 1D:
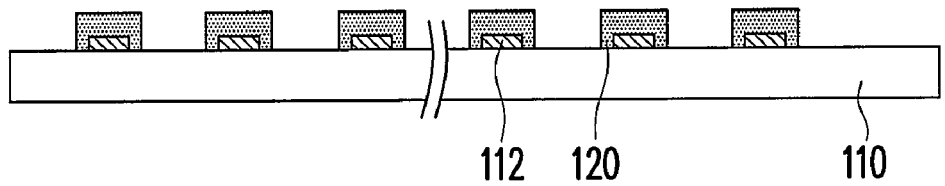

Referring to FIGS. 1C and 1D, photolithography and etching are performed on the spacing material layer 120a. For example, in particular, a mask 50 is provided between an exposure light source 30 and the spacing material layer 120a so as to partially expose the spacing material layer 120a, and then the spacing material layer 120a is developed. The exposure light source 30 is, for example, the ultraviolet rays, and the method for development is, for example, removing the unexposed part of the spacing material layer 120a in the water with a temperature of 50° C. With this, the fabrication of the patterned spacing layer 120 is completed. The patterned spacing layer 120 may cover or may not cover the electronic elements 112, and in this embodiment the electronic elements 112 are covered. When the patterned spacing layer 120 covers the electronic elements 112, the patterned spacing layer 120 also functions as a protective layer to protect the electronic elements 112 from being damaged by water, oxygen, and contaminants in the environment. The material of the patterned spacing layer 120 can be one of various types of polymers including photo-patterned polymers, organic polymers, inorganic polymers, macromolecular polymers, micromolecular polymers, resins, or a combination thereof. In particular, the material of the patterned spacing layer 120 is, for example, DCPVA, PVP, PI, or a combination thereof.

Figure 1E:
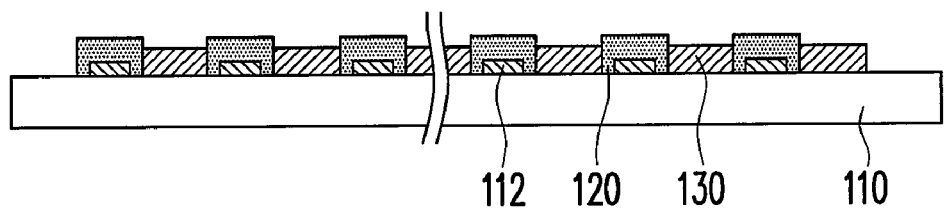

Referring to FIG. 1E, a plurality of electronic elements 130 is selectively fabricated on the flexible substrate 110 in an area without covered by the patterned spacing layer 120. In this embodiment, the electronic elements 130 are OLEDs. It should be noted that in the method of fabricating the organic electronic device of this embodiment, it is within the scope of the present invention as long as one of electronic elements 112 and 130 are organic electronic elements, and in the method of fabricating the organic electronic device, it is allowed to only fabricate electronic elements 112 or only fabricate electronic elements 130.

Figure 1F:
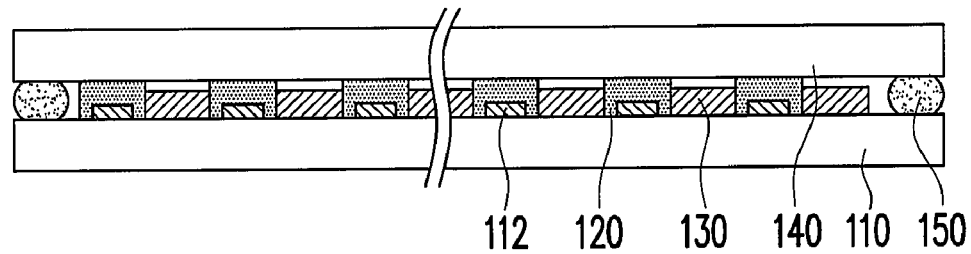

Referring to FIG. 1F, a cover substrate 140 is arranged on the patterned spacing layer 120, i.e. the cover substrate 140 is in contact with the patterned spacing layer 120, and the patterned spacing layer 120 is used to maintain a space between the flexible substrate 110 and the cover substrate 140. Meanwhile, a sealant 150 is arranged at the edges of the flexible substrate 110 and the cover substrate 140 so as to seal the flexible substrate 110 and the cover substrate 140 with the sealant 150.

Embodiment 2

Figure 2A:
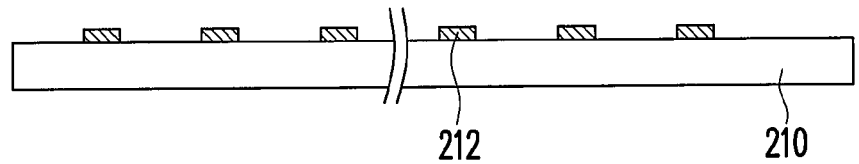
FIGS. 2A-2D are sectional views of the flow of the method of fabricating the organic electronic device according to the second embodiment of the present invention.

FIGS. 2A-2D are sectional views of the flow of the method of fabricating the organic electronic device according to the second embodiment of the present invention. Only features different from that of the Embodiment 1 will be described below; the same features will be omitted. Referring to FIG. 2A, the method of fabricating the electronic device of the embodiment comprises providing a flexible substrate 210 first. A plurality of electronic elements 212 can be selectively formed on the flexible substrate 210.

Figure 2B:
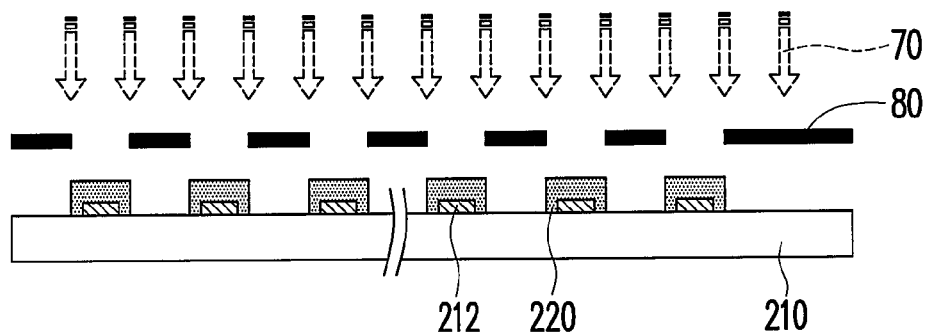

Referring to FIG. 2B, a patterned spacing layer 220 is deposited on the flexible substrate 210 with using a spacing material deposition source 70 and a mask 80. When the patterned spacing layer 220 is deposited, the mask 80 is arranged between the flexible substrate 210 and the spacing material deposition source 70, so that the spacing material can be deposited on the flexible substrate 210 through the hollowed-out part of the mask 80. Furthermore, the method of depositing the patterned spacing layer 220 may comprise at least one of PECVD, VTE, E-beam Evaporation, sputtering, another appropriate method or any combination thereof. Specifically, VTE and E-beam Evaporation may be used together. The patterned spacing layer 220 may cover or may not cover electronic elements 212. The patterned spacing layer 220 can function as a protective layer when it covers the electronic elements 212. The material of the patterned spacing layer 220 may be one of various types of polymers including organic polymers, inorganic polymers, macromolecular polymers, micromolecular polymers, organic oligomer, resins, polymers mixed with microcolumns, or a combination thereof. In particular, the material of the patterned spacing layer 220 is, for example, parylene. Moreover, the material of the patterned spacing layer 220 may be an oxide, for example, a metal oxide derivative.

Figure 2C:
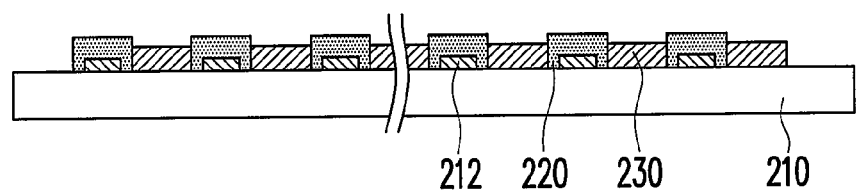

Referring to FIG. 2C, a plurality of electronic elements 230 is selectively fabricated on the flexible substrate 210 in an area without covered by the patterned spacing layer 220.

Figure 2D:
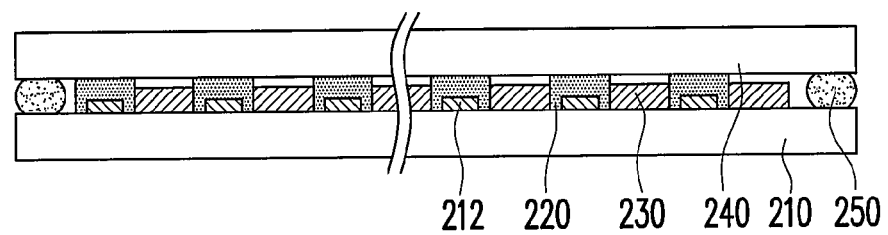

Referring to FIG. 2D, a cover substrate 240 is arranged on the patterned spacing layer 220, i.e. the cover substrate 240 is in contact with the patterned spacing layer 220, and the patterned spacing layer 220 is used to maintain a space between the flexible substrate 210 and the cover substrate 240. Meanwhile, a sealant 250 is arranged at the edges of the flexible substrate 210 and the cover substrate 240 so as to seal the flexible substrate 210 and the cover substrate 240 with the sealant 250.

Embodiment 3

Figure 3A:
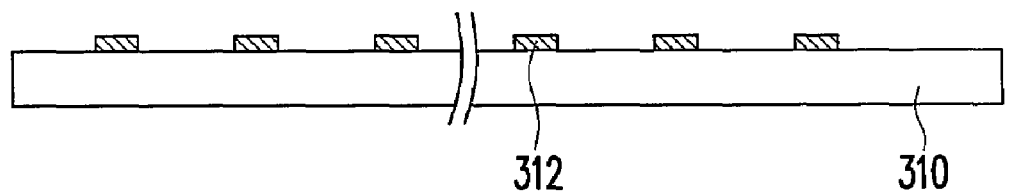
FIGS. 3A-3F are sectional views of the flow of the method of fabricating the organic electronic device according to the third embodiment of the present invention.

FIGS. 3A-3F are sectional views of the flow of the method of fabricating the organic electronic device according to the third embodiment of the present invention. Only features different from that of the Embodiment 2 will be described below; the same features will be omitted. Referring to FIG. 3A, the method of fabricating the electronic device of the embodiment comprises providing a flexible substrate 310 first. A plurality of electronic elements 312 can be selectively formed on the flexible substrate 310.

Figure 3B:
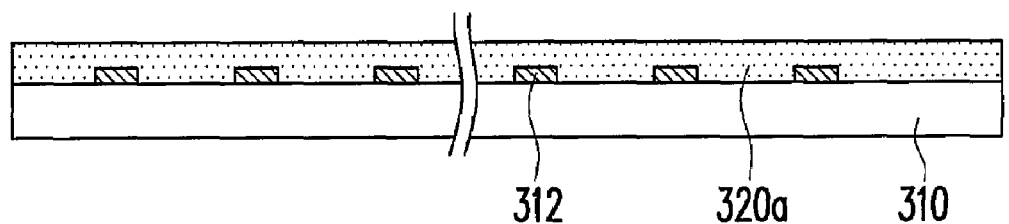

Referring to FIG. 3B, a spacing material layer 320a is coated on the flexible substrate 310. Furthermore, the method of depositing the spacing material layer 320a may comprise at least one of PECVD, VTE, E-beam Evaporation, sputtering, another appropriate method or any combination thereof. Specifically, VTE and E-beam Evaporation may be used together.

Figure 3C:
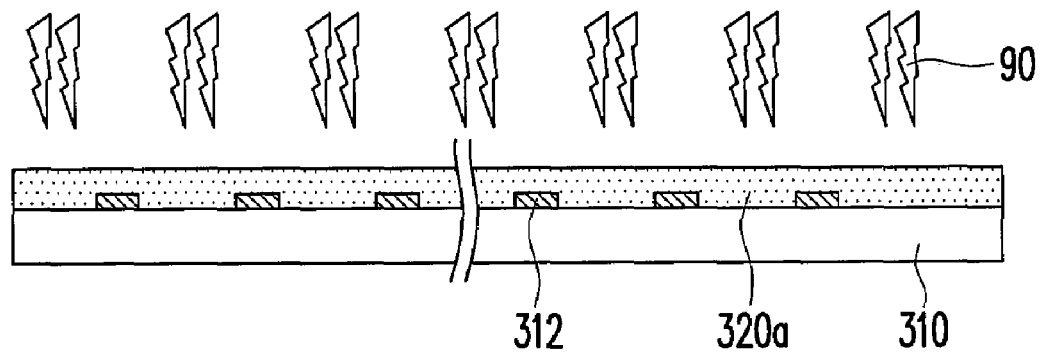
Figure 3D:
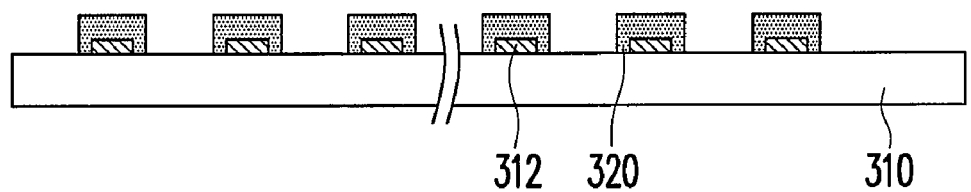

Referring to FIGS. 3C and 3D, the spacing material layer 320a is patterned by performing photo cracking or thermal cracking with, for example, laser 90 so as to form a patterned spacing layer 320. The material selection of the patterned spacing layer 320 is the same as that of the patterned spacing layer 220 of Embodiment 2.

Figure 3E:
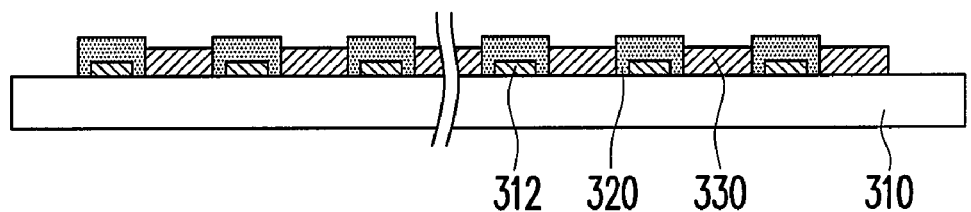

Referring to FIG. 3E, a plurality of electronic elements 330 is selectively fabricated on the flexible substrate 310 in an area without covered by the patterned spacing layer 320.

Figure 3F:
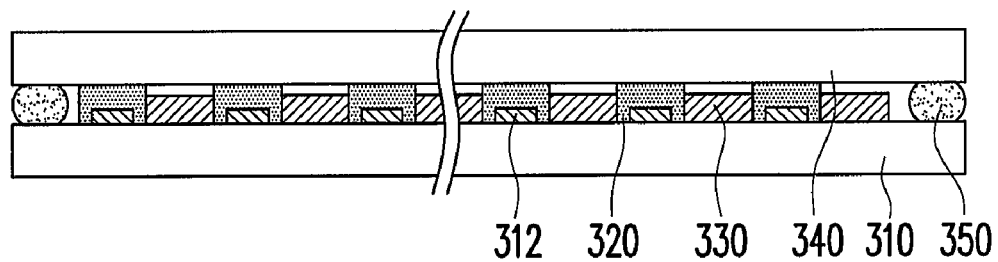

Referring to FIG. 3F, a cover substrate 340 is arranged on the patterned spacing layer 320, i.e. the cover substrate 340 is in contact with the patterned spacing layer 320, and the patterned spacing layer 320 is used to maintain a space between the flexible substrate 310 and the cover substrate 340. Meanwhile, a sealant 350 is arranged at the edges of the flexible substrate 310 and the cover substrate 340 so as to seal the flexible substrate 310 and the cover substrate 340 with the sealant 350.

To sum up, in the method of fabricating the organic electronic device of the present invention, a patterned spacing layer is fabricated between a flexible substrate and a cover substrate to maintain a space, and further to prevent the electronic elements from being worn, scratched, and even damaged by the cover substrate since the electronic elements will not be in contact with the cover substrate when the organic electronic device is flexed. Furthermore, the patterned spacing layer can selectively cover the organic elements to protect the organic elements from being damaged by water, oxygen, contaminants, etc. in the environment. In addition, the present invention also has the advantage that the patterned spacing layer can be localized with high precision. Meanwhile, the process of the present invention is compatible with the roll-to-roll process and the batch type process, therefore, mass production can be achieved, and the fabricating cost can be reduced as well.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating an organic electronic device, comprising:
   providing a flexible substrate;
   fabricating a plurality of organic elements on the flexible substrate, wherein the organic elements are thin film transistors;
   fabricating a patterned spacing layer on the flexible substrate;
   fabricating a plurality of organic electro luminescent devices (OELDs) on the flexible substrate in an area that is not covered by the patterned spacing layer; and
   arranging a cover substrate on the patterned spacing layer, and sealing the edges of the flexible substrate and the cover substrate with a sealant, wherein the patterned spacing layer is used to maintain a space between the flexible substrate and the cover substrate.

2. The method of fabricating an organic electronic device as claimed in claim 1, wherein the step for fabricating the organic elements is performed before fabricating the patterned spacing layer.

3. The method of fabricating an organic electronic device as claimed in claim 2, wherein the step for fabricating the patterned spacing layer includes covering the organic elements with the patterned spacing layer.

4. The method of fabricating an organic electronic device as claimed in claim 1, wherein the step for fabricating the organic elements is performed after fabricating the patterned spacing layer, the organic elements are formed on the flexible substrate in an area that is not covered by the patterned spacing layer, and the organic elements include organic electro luminescent devices.

5. The method of fabricating an organic electronic device as claimed in claim 1, wherein the process of fabricating the patterned spacing layer comprises:
   coating a spacing material layer on the flexible substrate; and
   patterning the spacing material layer to form the patterned spacing layer.

6. The method of fabricating an organic electronic device as claimed in claim 5, wherein after coating the spacing material layer and before patterning the spacing material layer, further comprises pre-baking the spacing material layer.

7. The method of fabricating the organic electronic device as claimed in claim 5, wherein the process of coating the spacing material layer includes spin coating.

8. The method of fabricating an organic electronic device as claimed in claim 5, wherein the spacing material layer is photosensitive, and the process of patterning the spacing material layer includes photolithography and etching.

9. The method of fabricating an organic electronic device as claimed in claim 5, wherein the material of the patterned spacing layer includes polymers.

10. The method of fabricating an organic electronic device as claimed in claim 5, wherein the material of the patterned spacing layer includes photo-patterned polymers.

11. The method of fabricating an organic electronic device as claimed in claim 5, wherein the material of the patterned spacing layer includes polymers mixed with microcolumns.

12. The method of fabricating an organic electronic device as claimed in claim 5, wherein the material of the patterned spacing layer includes photo-patterned polymers and polymers mixed with microcolumns.

13. The method of fabricating an organic electronic device as claimed in claim 5, wherein the material of the patterned spacing layer includes dichromated polyvinyl alcohol (DCPVA).

14. The method of fabricating an organic electronic device as claimed in claim 5, wherein the material of the patterned spacing layer includes polyvinyl pyrrolidone (PVP).

15. The method of fabricating an organic electronic device as claimed in claim 5, wherein the material of the patterned spacing layer includes polyimide (PI).

16. The method of fabricating an organic electronic device as claimed in claim 5, wherein the material of the patterned spacing layer includes DCPVA and PVP.

17. The method of fabricating an organic electronic device as claimed in claim 5, wherein the material of the patterned spacing layer includes DCPVA and PI.

18. The method of fabricating an organic electronic device as claimed in claim 5, wherein the material of the patterned spacing layer includes PVP and PI.

19. The method of fabricating an organic electronic device as claimed in claim 5, wherein the material of the patterned spacing layer includes DCPVA, PVP, and PI.

* * * * *